(12) United States Patent
Yang et al.

(10) Patent No.: US 11,566,882 B2
(45) Date of Patent: Jan. 31, 2023

(54) MAGNETIC TAG SENSOR AND METHOD FOR MANUFACTURING SAME, AND RIVERBED SCOUR DETECTION DEVICE

(71) Applicant: SHANDONG UNIVERSITY, Shandong (CN)

(72) Inventors: Zeying Yang, Jinan (CN); Jianbo Qu, Jinan (CN); Shucai Li, Jinan (CN); Qingsong Zhang, Jinan (CN); Xinzhuang Cui, Jinan (CN); Zhi Ge, Jinan (CN); Hetao Hou, Jinan (CN); Li Tian, Jinan (CN); Ke Wu, Jinan (CN); Tianmin Wang, Jinan (CN); Yuhui Shan, Jinan (CN); Fengjin Zhao, Jinan (CN); Peng Zhang, Jinan (CN); Jie Liu, Jinan (CN); Minghao Sun, Jinan (CN); Weisong Qu, Jinan (CN); Cuiping Qu, Jinan (CN); Qianyi Yang, Jinan (CN); Zhenyu Zhao, Jinan (CN); Yuntong Guo, Jinan (CN); Haoze Yu, Jinan (CN); Yinglin Sun, Jinan (CN)

(73) Assignee: SHANDONG UNIVERSITY, Jinan (CN)

( * ) Notice: Subject to any disclaimer, the term of this patent is extended or adjusted under 35 U.S.C. 154(b) by 123 days.

(21) Appl. No.: 17/282,962

(22) PCT Filed: Jul. 23, 2019

(86) PCT No.: PCT/CN2019/097266
§ 371 (c)(1),
(2) Date: Apr. 5, 2021

(87) PCT Pub. No.: WO2020/211208
PCT Pub. Date: Oct. 22, 2020

(65) Prior Publication Data
US 2021/0356248 A1    Nov. 18, 2021

(30) Foreign Application Priority Data

Apr. 16, 2019 (CN) .......................... 201910305365.8

(51) Int. Cl.
*G01B 7/26* (2006.01)
*G01F 23/00* (2022.01)
(Continued)

(52) U.S. Cl.
CPC .......... *G01B 7/26* (2013.01); *G01F 23/0046* (2013.01); *G01R 33/10* (2013.01); *G01V 15/00* (2013.01)

(58) Field of Classification Search
None
See application file for complete search history.

(56) References Cited

U.S. PATENT DOCUMENTS 5,532,687 A * 7/1996 Richardson ............. G01F 23/74
405/15
2008/0271803 A1* 11/2008 Corren .................... F16L 39/00
138/109

FOREIGN PATENT DOCUMENTS

CN    201104235 Y    8/2008
CN    101334261 A    12/2008
(Continued)

OTHER PUBLICATIONS

Kim Byoung Cheol; He Underground Rise and Fall System by Instrumentation Measured Supervisory Remote and Incoming Switchboard Control Panel; KR 101300252 B1;Date Published Sep. 10, 2013; CPC H 02 B 7/08 (Year: 2013).*
Jan. 15, 2020 International Search Report issued in International Patent Application No. PCT/CN2019/097266.
Jan. 15, 2020 Written Opinion issued in International Patent Application No. PCT/CN2019/097266.
(Continued)

*Primary Examiner* — Nasima Monsur
(74) *Attorney, Agent, or Firm* — Oliff PLC

(57) ABSTRACT

A magnetic tag sensor includes a cylinder and threaded pipe embedded therein and simulates a magnetic dipole; two
(Continued)

threaded pipe wiring interfaces being connected to first and second cables, running through a cylinder upper cross-section outer wall and extending out of the cylinder; the cylinder is sleeved on a guide rail and at a junction between a riverbed and water; an guide rail end inserts into the riverbed, a water sealing box is mounted on a top of the guide rail, a power supply module, a relay and a load arranged inside the water sealing box, the first cable connected to a positive pole of the power supply module, and the second cable connected to a negative pole through the relay and load connected in series; and the threaded pipe in the wall of the cylinder moves up and down with the riverbed to generate a magnetic field signal.

8 Claims, 2 Drawing Sheets

(51) Int. Cl.
*G01R 33/10* (2006.01)
*G01V 15/00* (2006.01)

(56) References Cited

FOREIGN PATENT DOCUMENTS

| | | |
|---|---|---|
| CN | 102071661 A | 5/2011 |
| CN | 102622636 A | 8/2012 |
| CN | 204286386 U | 4/2015 |
| CN | 105696637 A | 6/2016 |
| CN | 106052604 A | 10/2016 |
| CN | 106917420 A | 7/2017 |
| CN | 107289996 A | 10/2017 |
| CN | 107702639 A | 2/2018 |
| CN | 208329020 U | 1/2019 |
| CN | 109425724 A | 3/2019 |
| CN | 109883454 A | 6/2019 |
| JP | 2004-347533 A | 12/2004 |

OTHER PUBLICATIONS

Nov. 26, 2019 Office Action issued in Chinese Patent Application No. 201910305365.8.

\* cited by examiner

MAGNETIC TAG SENSOR AND METHOD FOR MANUFACTURING SAME, AND RIVERBED SCOUR DETECTION DEVICE

BACKGROUND

Technical Field

The present disclosure belongs to the field of bridge traffic facilities, and in particular, to a magnetic tag sensor and a method for manufacturing same, and a riverbed scour detection device.

Related Art

The description in this section merely provides background information related to the present disclosure and does not necessarily constitute the prior art.

Riverbed scour is a main cause of a bridge disaster by flood. When a river passes through a substructure of a bridge, the river scours the riverbed, especially the riverbed near bridge piers. The prolonged scouring causes the riverbed to sink, and the bridge piers and abutments are gradually exposed to the water environment. The bearing capacity of the bridge piers and abutments that lose the surrounding riverbed support decreases seriously, causing collapses.

The inventor finds that the existing riverbed monitoring methods have disadvantages such as inaccurate positioning, harsh working environment requirements, and lack of universality.

SUMMARY

To resolve the foregoing problems, in a first aspect of the present disclosure, a magnetic tag sensor is provided. The magnetic tag sensor highly simulates a magnetic dipole module in form and height, and the generated magnetic field is more stable, which is convenient for later analysis.

To achieve the foregoing objective, the present disclosure uses the following technical solutions:

A magnetic tag sensor, including:

a cylinder, where a threaded pipe is embedded in a wall of a cylinder, the threaded pipe is configured to simulate a magnetic dipole; two wiring interfaces of the threaded pipe are respectively connected to a first cable and a second cable and run through an outer wall of an upper cross-section of the cylinder and extend out of the cylinder; the cylinder is sleeved on a guide rail, and is disposed at a junction between a riverbed and water; an end of the guide rail inserts into the riverbed, a water sealing box is mounted on a top of the guide rail, a power supply module, a relay and a load are arranged inside the water sealing box, the first cable is connected to a positive pole of the power supply module, and the second cable is connected to a negative pole of the power supply module through the relay and load connected in series; and the threaded pipe in the wall of the cylinder moves up and down with the riverbed to generate a magnetic field signal.

To resolve the foregoing problems, in a second aspect of the present disclosure, a method for manufacturing a magnetic tag sensor is provided. The manufacturing method is simple, and the manufactured magnetic tag sensor highly simulates a magnetic dipole module in form and height, so that the generated magnetic field is more stable, which is convenient for later analysis.

To achieve the foregoing objective, the present disclosure uses the following technical solutions:

A method for manufacturing a magnetic tag sensor, including:

(1) setting a required quantity of turns and radius of the solenoid, and winding the solenoid, where two wiring interfaces of the solenoid may be simultaneously placed above the solenoid;

(2) manufacturing a cylinder concrete mold according to a parameter of the solenoid, the solenoid having protective layers up and down and inside and outside;

(3) preparing concrete according to a standard grade of waterproof concrete, and putting the solenoid into the mold, where the two wiring interfaces of the solenoid are connected to the first cable and the second cable and extend out of the mold from above, pouring the prepared concrete, and removing the mold and maintaining the solenoid at a specified time;

(4) selecting the guide rail with a corresponding parameter according to an inner diameter and a height of the manufactured body cylinder;

(5) selecting a waterproof material to manufacture the upper cover of the water sealing box;

(6) connecting the power supply module to the relay, the load, and the first cable and the second cable that are sealed through the water sealing box, and then connecting the upper cover to the base through the circumferential bolt and the sealing gasket, to form the water sealing box; and (7) inserting the body cylinder from a bottom of the guide rail, reserving an enough length for the first cable and second cable to enable the cylinder to move down along the guide rail, and inserting the guide rail into the riverbed that needs to be monitored, so that a bottom surface of the cylinder fits the riverbed, and moves down following scouring of the riverbed.

To resolve the foregoing problems, in a third aspect of the present disclosure, a riverbed scour detection device is provided, including a magnetic tag sensor that highly simulates a magnetic dipole module in form and height. A magnetic field generated by the magnetic tag sensor is more stable, thereby improving accuracy and stability of riverbed scour detection.

To achieve the foregoing objective, the present disclosure uses the following technical solutions:

A riverbed scour detection device, including the foregoing magnetic tag sensor;

the magnetic tag sensor is connected to a processor, and the processor is configured to:

receive a magnetic field signal detected by the magnetic tag sensor, where an XOY plane of the magnetic field signal is parallel to a horizontal cross-section of the magnetic tag sensor; and obtain a single-degree-of-freedom positioning formula of the magnetic dipole according to a spatial distribution mode of a magnetic field strength of the magnetic dipole:

$$\frac{2B_r}{B_z}h^2 - 3ah + \frac{B_r}{B_z}(2R^2 - a^2) = 0$$

$$Br = \frac{\sqrt{B_y^2 + B_x^2}}{B_z}$$

where Bz is an axial magnetic field strength component of the magnetic dipole at a point P in space;

Bx is a lateral magnetic field strength component of the magnetic dipole at a point P in space;

$B_y$ is a longitudinal magnetic field strength component of the magnetic dipole at a point P in space; and h is a to-be-measured level difference, R is a magnetic moment radius of the magnetic dipole, and a is a horizontal distance from the magnetic dipole to a to-be-measured point P.

Beneficial effects of the present disclosure are as follows:

In the present disclosure, a cylinder is sleeved on a guide rail to restrict a degree of freedom of a magnetic tag sensor, and the magnetic tag sensor is provided with a power supply module, and can generate a stable magnetic field, which further lays the foundation for improving the accuracy and stability of riverbed scour detection.

BRIEF DESCRIPTION OF THE DRAWINGS

The accompanying drawings constituting a part of the present disclosure are used to provide further understanding of the present disclosure. Exemplary embodiments of the present disclosure and descriptions thereof are used to explain the present disclosure, and do not constitute an improper limitation to the present disclosure.

1-Cylinder; 2-Solenoid; 3-First wiring interface; 4-Second wiring interface; 5-Guide rail; 5'-Guide rail End; 6-Water sealing box; 6'-Water sealing box Upper cover; 7-Power supply module; 8-Load; 9-Relay; 10-First cable ; 11-Second cable ; 12-Mounting platform; 13-Riverbed; 14-Controller; 15-Magnetic tag sensor; 16-Remote monitoring terminal; 17-Circumferential bolt; 18-Sealing gasket; (+)-Positive pole; (-)-Negative pole.

DETAILED DESCRIPTION

The present disclosure is further described below with reference to the accompanying drawings and embodiments.

It should be noted that the following detailed descriptions are all exemplary and are intended to provide a further description of the present disclosure. Unless otherwise specified, all technical and scientific terms used herein have the same meaning as commonly understood by a person of ordinary skill in the art to which the present disclosure belongs.

It should be noted that the terms used herein are merely used for describing specific implementations, and are not intended to limit exemplary implementations of the present disclosure. As used herein, the singular form is intended to include the plural form, unless the context clearly indicates otherwise. In addition, it should be further understood that terms "include" and/or "comprise" used in this specification indicate that there are features, steps, operations, devices, assemblies, and/or combinations thereof.

In the present disclosure, orientation or position relationships indicated by the terms such as "upper", "lower", "left", "right" "front", "rear", "vertical", "horizontal", "side", and "bottom" are based on orientation or position relationships shown in the accompanying drawings, and are merely relationship words that are determined for ease of describing the structural relationship between components or elements in the present disclosure, and are not intended to specifically refer to any component or element in the present disclosure. Therefore, such terms should not be construed as a limitation on the present disclosure.

In the present disclosure, terms such as "fixedly connected", "interconnection", and "connection" should be understood in a broad sense. The connection may be a fixing connection, an integral connection or a detachable connection; or the connection may be a direct connection, or an indirect connection by using an intermediary. Relevant scientific research or technical personnel in the art may determine the specific meanings of the foregoing terms in the present disclosure according to specific situations, and such terms should not be construed as a limitation on the present disclosure.

Figure 1:
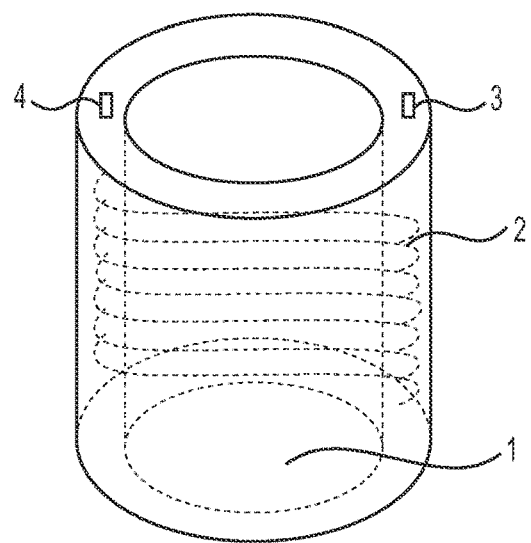
FIG. 1 is a schematic structural diagram of a cylinder according to an embodiment of the present disclosure.
Figure 2:
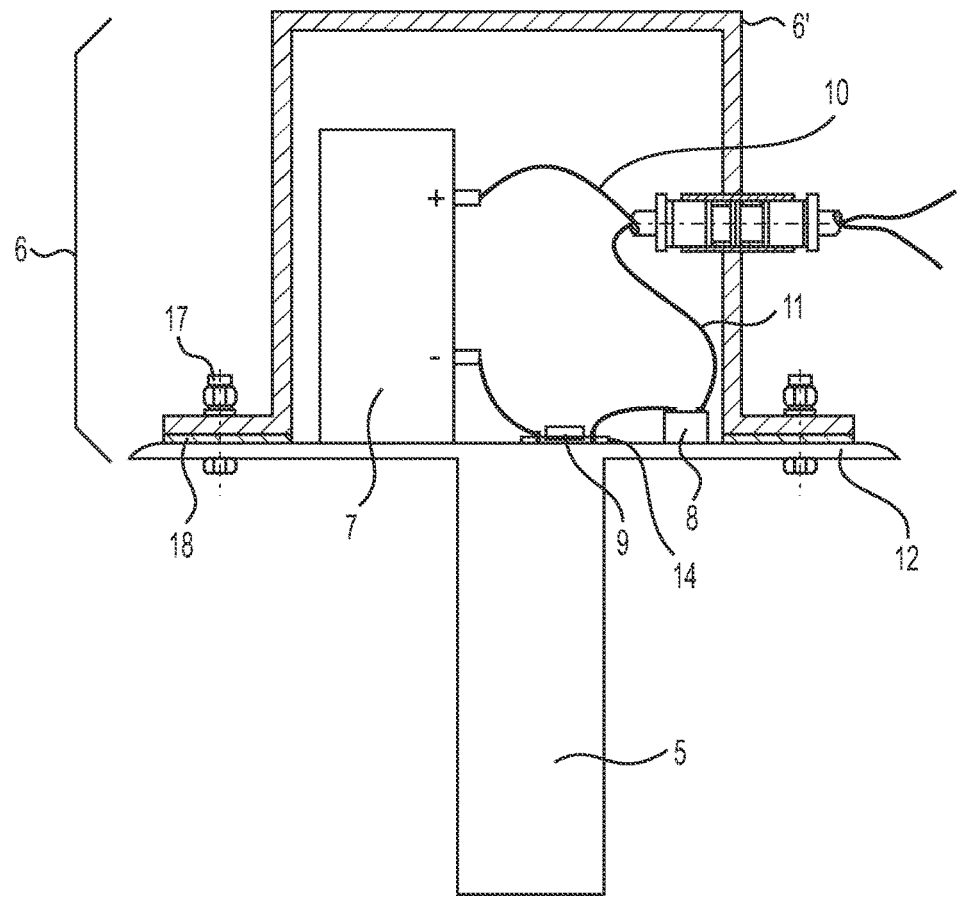
FIG. 2 is a schematic structural diagram of a guide rail and a water sealing box according to an embodiment of the present disclosure.
Figure 3:
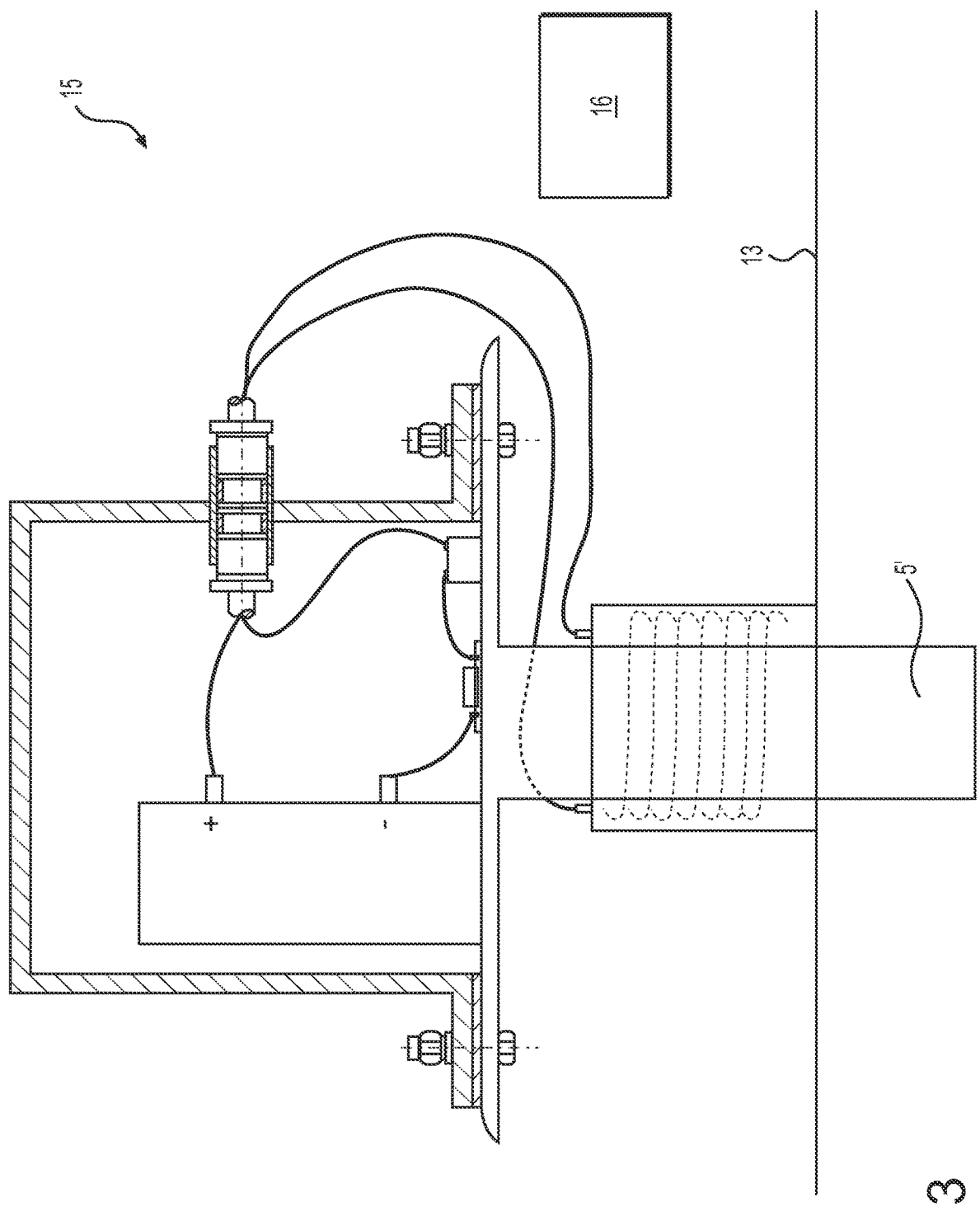
FIG. 3 is a schematic structural diagram of the guide rail and water sealing box according to FIG. 2 attached to the cylinder of FIG. 1.

A magnetic tag sensor 15 according to this embodiment includes:

a cylinder 1, where a solenoid 2 is embedded in a wall of the cylinder 1, the solenoid 2 is configured to simulate a magnetic dipole; two wiring interfaces, first wiring interface 3 and second wiring interface 4 of the solenoid are respectively connected to a first cable 10 and a second cable 11 and run through an outer wall of an upper cross-section of the cylinder 1 and extends out of the cylinder 1, as shown in FIG. 1; and as shown in FIG. 3, the cylinder 1 is sleeved on a guide rail 5, the cylinder 1 is disposed at a junction between a riverbed 13 and water; an end 5' of the guide rail 5 inserts into the riverbed 13, a water sealing box 6 is mounted on a top of the guide rail 5, as shown in FIG. 2, a power supply module 7, a relay 9 and a load 8 are arranged inside the water sealing box 6, the first cable 10 is connected to a positive pole (+) of the power supply module 7, and the second cable 11 is connected to a negative pole (−) of the power supply module 7 through the relay 9 and load 8 connected in series; and the solenoid 2 in the wall of the cylinder 1 moves up and down with the riverbed 13 to generate a magnetic field signal.

It should be noted that the load may be implemented by using a resistor or another resistive load.

In an implementation, the power supply module is a storage battery.

The storage battery may perform monitoring when the monitored riverbed cannot meet the power supply requirement.

It may be understood that, the power supply module may also be another power supply structure, such as a lithium battery. Choices can be made by a person skilled in the art according to the actual situation, and are not repeated herein.

In an implementation, the material of the cylinder is waterproof concrete, and ferric chloride is added to enhance impermeability.

In an implementation, a height range of the cylinder is determined according to a required height of a solenoid, and an inner diameter and an outer diameter of the cylinder are determined according to a required coil radius and winding thickness of the solenoid.

In an implementation, the solenoid is configured to simulate the magnetic dipole, and the solenoid is fixedly embedded in the wall of the cylinder, thereby playing a role in accurate positioning. A protective layer is reserved inside and outside the solenoid.

Specifically, a conductor material of the solenoid is protected by using a waterproof membrane, and epoxy zinc rich antirust paint is plated outside, to prevent water infiltration.

In an implementation, the material, a surface and a closure of the cylinder are all waterproofed.

In an implementation, the relay 9 is connected to a controller 14, and the controller 14 is connected to a remote monitoring terminal 16.

In this embodiment, a sensor switch may be controlled by the relay 9, to effectively separate mutual interference between an earth background magnetic field and a magnetic field of the sensor, and improve accuracy of riverbed 13 detection.

In an implementation, the water sealing box 6 is disposed on a mounting platform 12, and the mounting platform 12 is disposed on a top of the guide rail 5.

In an implementation, the mounting platform and the guide rail are an integral structure.

In this way, the material of the mounting platform is the same as that of the guide rail, and at the same time, the mounting platform is a base of the water sealing box, thereby playing a role in fixing the water sealing box.

In an implementation, the guide rail is a rigid guide rail; the material of the guide rail is a rigid waterproof nonconductor material (for example, PVC); and a shape of the guide rail is a cylinder, and a radius of the guide rail is less than the radius of the cylinder. The radius is required to make the body cylinder string and move down with the riverbed, and the height is required to make the body cylinder keep stable and higher than the riverbed by a distance after being inserted into the riverbed.

In an implementation, an upper cover of the water sealing box is a single-side-opening cuboid.

The upper cover 6' of the water sealing box 6 and the base of the mounting platform 12 are fixed by a circumferential bolt 17 and a sealing gasket 18, to ensure that the interior is isolated from a water environment;

a mounting hole of a cable cup-shaped pipe joint is processed on a side of the water sealing box, and the cable cup-shaped pipe joint is in sealed connection to the upper cover of the water sealing box.

In this embodiment, a cylinder is sleeved on a guide rail to restrict a degree of freedom of a magnetic tag sensor, and the magnetic tag sensor is provided with a power supply module, and can generate a stable magnetic field, which further lays the foundation for improving the accuracy and stability of riverbed scour detection.

In another embodiment, a method for manufacturing a magnetic tag sensor is further provided.

The method for manufacturing the magnetic tag sensor includes the following steps:

(1) setting a required quantity of turns and radius of the solenoid, and winding the solenoid, where two wiring interfaces of the solenoid may be simultaneously placed above the solenoid;

specifically, a required quantity of turns and radius of the solenoid are set according to a positioning principle of a selected acquisition device (the sensor is suitable for acquisition through a single-degree-of-freedom positioning principle of a magnetic dipole), and a hard waterproof wire is selected to wind the solenoid. Epoxy zinc rich antirust paint is plated on the surface and two wiring interfaces of the solenoid may be simultaneously disposed above the solenoid (the lower wiring interface may be extended at a last turn and return to the top);

(2) manufacturing a cylinder concrete mold according to a parameter of the solenoid, the solenoid having protective layers up and down and inside and outside;

for example, the thickness of the protective layer is 1.5 cm;

(3) preparing concrete according to a standard grade of waterproof concrete, and putting the solenoid into the mold, where the two wiring interfaces of the solenoid are connected to the first cable and the second cable and extend out of the mold from above, pouring the prepared concrete, and removing the mold and maintaining the solenoid at a specified time;

specifically, the concrete is prepared according to the standard grade of the waterproof concrete, a suitable amount of ferric chloride admixture is added to the concrete; the solenoid is put into the mold, where the two wiring interfaces of the solenoid are connected to a waterproof cable and extend out of the mold from above, the prepared concrete is poured, and the mold is removed and the solenoid is maintained at a specified time; after the concrete is completely hardened, the surface is plated with the epoxy zinc rich antirust paint;

(4) selecting the guide rail with a corresponding parameter according to an inner diameter and a height of the manufactured body cylinder;

(5) selecting a waterproof material to manufacture the upper cover of the water sealing box;

in addition, a mounting hole of a cable cup-shaped pipe joint is processed on a side of the water sealing box, and the cable cup-shaped pipe joint is in sealed connection to the upper cover of the water sealing box;

(6) connecting the power supply module to the relay, the load, and the first cable and the second cable that are sealed through the water sealing box, and then connecting the upper cover to the base through the circumferential bolt and the sealing gasket, to form the water sealing box; and (7) inserting the body cylinder from a bottom of the guide rail, reserving an enough length for the first cable and second cable to enable the cylinder to move down along the guide rail, and inserting the guide rail into the riverbed that needs to be monitored, so that a bottom surface of the cylinder fits the riverbed, and moves down following scouring of the riverbed.

In this embodiment, the method for manufacturing the magnetic tag sensor is simple, and the manufactured magnetic tag sensor highly simulates a magnetic dipole module in form and height, so that the generated magnetic field is more stable, which is convenient for later analysis.

In another embodiment, a riverbed scour detection device is further provided.

A riverbed scour detection device includes the foregoing magnetic tag sensor;

the magnetic tag sensor is connected to a processor, and the processor is configured to:

receive a magnetic field signal detected by the magnetic tag sensor, where an XOY plane of the magnetic field signal is parallel to a horizontal cross-section of the magnetic tag sensor; and obtain a single-degree-of-freedom positioning formula of the magnetic dipole according to a spatial distribution mode of a magnetic field strength of the magnetic dipole:

$$\frac{2B_r}{B_z}h^2 - 3ah + \frac{B_r}{B_z}(2R^2 - a^2) = 0$$

$$Br = \frac{\sqrt{B_y^2 + B_x^2}}{B_z}$$

where $B_z$ is an axial magnetic field strength component of the magnetic dipole at a point P in space;

$B_x$ is a lateral magnetic field strength component of the magnetic dipole at a point P in space;

By is a longitudinal magnetic field strength component of the magnetic dipole at a point P in space; and h is a to-be-measured level difference, R is a magnetic moment radius of the magnetic dipole, and a is a horizontal distance from the magnetic dipole to a to-be-measured point P.

In this embodiment, the riverbed scour detection device includes the magnetic tag sensor that highly simulates a magnetic dipole module in form and height. A magnetic field generated by the magnetic tag sensor is more stable, thereby improving accuracy and stability of riverbed scour detection.

The foregoing descriptions are merely exemplary embodiments of the present disclosure, but are not intended to limit the present disclosure. The present disclosure may include various modifications and changes for a person skilled in the art. Any modification, equivalent replacement, or improvement made within the spirit and principle of the present disclosure shall fall within the protection scope of the present disclosure.

What is claimed is:

1. A method for manufacturing a magnetic tag sensor the method comprising:
   (1) setting a required quantity of turns and radius of a solenoid, and winding the solenoid, wherein two wiring interfaces of the solenoid may be simultaneously placed above the solenoid;
   (2) manufacturing a cylinder concrete mold according to a parameter of the solenoid, the solenoid having protective layers up and down and inside and outside;
   (3) preparing concrete according to a standard grade of waterproof concrete, and putting the solenoid into the mold, wherein the two wiring interfaces of the solenoid are connected to a first cable and a second cable and extend out of the mold from above, pouring the prepared concrete, and removing the mold and maintaining the solenoid at a specified time to produce a cylinder;
   (4) selecting a guide rail with a corresponding parameter according to an inner diameter and a height of the cylinder;
   (5) selecting a waterproof material to manufacture an upper cover of a water sealing box;
   (6) connecting a power supply module to the relay, a relay, a load, and the first cable and the second cable that are sealed through the water sealing box, and then connecting the upper cover to a mounting platform through a circumferential bolt and a sealing gasket, to form the water sealing box; and
   (7) inserting the cylinder from a bottom of the guide rail, reserving an enough length for the first cable and second cable to enable the cylinder to move down along the guide rail, and inserting the guide rail into a riverbed to be monitored, so that a bottom surface of the cylinder fits the riverbed, and moves down following scouring of the riverbed,
   wherein the magnetic tag sensor comprises: the cylinder sleeved on the guide rail and disposed at a junction between the riverbed and water; the solenoid embedded in a wall of the cylinder, the solenoid being configured to simulate a magnetic dipole and move up and down with the riverbed to generate a magnetic field signal; the two wiring interfaces of the solenoid that are respectively connected to the first cable and the second cable and run through an outer wall of an upper cross-section of the cylinder and extend out of the cylinder; an end of the guide rail that inserts into the riverbed; the water sealing box mounted on a top of the guide rail; the power supply module disposed inside the water sealing box; the relay and the load disposed inside the water sealing box and connected in series; a positive pole of the power supply module connected to the first cable; and a negative pole of the power supply module connected to the second cable through the relay and the load.

2. The method according to claim 1, wherein the relay is connected to a controller, and the controller is connected to a remote monitoring terminal.

3. The method according to claim 1, wherein the water sealing box is disposed on a mounting platform, and the mounting platform is disposed on the top of the guide rail.

4. The method according to claim 3, wherein the mounting platform and the guide rail are an integral structure.

5. The method according to claim 1, wherein the guide rail is a rigid guide rail;
   or
   a material of the guide rail is a rigid waterproof non-conductor material;
   or
   a shape of the guide rail is cylindrical, and a radius of the guide rail is less than a radius of the cylinder.

6. The method according to claim 1, wherein ferric chloride is added to the waterproof concrete to enhance impermeability.

7. The method according to claim 1, wherein the upper cover of the water sealing box is a single-side-opening cuboid.

8. A riverbed scour detection device, comprising:
   a magnetic tag sensor comprising:
      a cylinder sleeved on a guide rail and disposed at a junction between a riverbed and water;
      a solenoid embedded in a wall of the cylinder, the solenoid being configured to simulate a magnetic dipole and move up and down with the riverbed to generate a magnetic field signal;
      two wiring interfaces of the solenoid that are respectively connected to a first cable and a second cable and run through an outer wall of an upper cross-section of the cylinder and extend out of the cylinder;
      an end of the guide rail that inserts into the riverbed;
      a water sealing box mounted on a top of the guide rail;
      a power supply module disposed inside the water sealing box;
      a relay and a load disposed inside the water sealing box and connected in series;
      a positive pole of the power supply module connected to the first cable; and
      a negative pole of the power supply module connected to the second cable through the relay and the load; and
   a processor connected to the magnetic tag sensor, the processor being configured to:
      receive the magnetic field signal detected by the magnetic tag sensor, wherein an XOY plane of the magnetic field signal is parallel to a horizontal cross-section of the magnetic tag sensor; and
      obtain a single-degree-of-freedom positioning formula of the magnetic dipole according to a spatial distribution mode of a magnetic field strength of the magnetic dipole:

$$\frac{2B_r}{B_z}h^2 - 3ah + \frac{B_r}{B_z}(2R^2 - a^2) = 0$$

-continued $$Br = \frac{\sqrt{B_y^2 + B_x^2}}{B_z}$$

wherein Bz is an axial magnetic field strength component of the magnetic dipole at a point P in space;

Bx is a lateral magnetic field strength component of the magnetic dipole at a point P in space;

By is a longitudinal magnetic field strength component of the magnetic dipole at a point P in space; and h is a to-be-measured level difference, R is a magnetic moment radius of the magnetic dipole, and a is a horizontal distance from the magnetic dipole to a to-be-measured point P.

* * * * *